(12) United States Patent
Kawamura et al.

(10) Patent No.: US 7,504,910 B2
(45) Date of Patent: Mar. 17, 2009

(54) THIN-FILM PIEZOELECTRIC RESONATOR UTILIZING A SECOND OR HIGHER HARMONIC MODE

(75) Inventors: Hideki Kawamura, Sagamihara (JP); Takahiro Oguchi, Yasu (JP); Keiichi Umeda, Omihachiman (JP); Hajime Yamada, Otsu (JP)

(73) Assignee: Murata Manufacturing Co., Ltd. (JP)

( * ) Notice: Subject to any disclaimer, the term of this patent is extended or adjusted under 35 U.S.C. 154(b) by 249 days.

(21) Appl. No.: 11/583,696

(22) Filed: Oct. 20, 2006

(65) Prior Publication Data

US 2007/0035207 A1 Feb. 15, 2007

Related U.S. Application Data

(63) Continuation of application No. PCT/JP2005/007834, filed on Apr. 25, 2005.

(30) Foreign Application Priority Data

Apr. 30, 2004 (JP) ............................. 2004-136940

(51) Int. Cl.
*H03H 9/15* (2006.01)
*H03H 9/54* (2006.01)

(52) U.S. Cl. ..................... 333/187; 333/189; 310/324; 310/335

(58) Field of Classification Search ............. 333/187, 333/189; 310/322, 324
See application file for complete search history.

(56) References Cited

U.S. PATENT DOCUMENTS

| 6,437,484 B1* | 8/2002 | Nishimura et al. | 310/324 |
| 6,657,517 B2* | 12/2003 | Barber et al. | 333/187 |
| 6,670,866 B2* | 12/2003 | Ella et al. | 333/133 |
| 7,002,437 B2* | 2/2006 | Takeuchi et al. | 333/187 |
| 2004/0164648 A1* | 8/2004 | Takeuchi et al. | 310/324 |
| 2006/0131990 A1* | 6/2006 | Milsom et al. | 310/311 |

FOREIGN PATENT DOCUMENTS

| JP | 60-068711 | 4/1985 |
| JP | 60-126907 | 7/1985 |
| JP | 08-018115 | 1/1996 |
| JP | 2000-196404 | 7/2000 |
| JP | 2000-307377 | 11/2000 |
| JP | 2000-332568 | 11/2000 |

(Continued)

OTHER PUBLICATIONS

Machine Translation of JP 2001-185985 published Jul. 2001.*

(Continued)

*Primary Examiner*—Barbara Summons
(74) *Attorney, Agent, or Firm*—Dickstein, Shapiro, LLP.

(57) ABSTRACT

A thin-film piezoelectric resonator having a thin-film portion with a piezoelectric thin film disposed between a pair of opposing electrodes, an insulating layer formed on one of the pair of electrodes of the thin-film portion, and a substrate supporting the other electrode of the thin-film portion. The thin-film portion and the insulating layer together vibrate in at least one mode of second and higher harmonic modes, and an antinode in the at least one mode of the second and higher harmonic modes is located in the insulating layer.

12 Claims, 13 Drawing Sheets

FOREIGN PATENT DOCUMENTS

| | | |
|---|---|---|
| JP | 2001-156582 | 6/2001 |
| JP | 2001-185985 | 7/2001 |
| JP | 2001-196895 | 7/2001 |
| JP | 2002-076823 | 3/2002 |
| JP | 2002-076824 | 3/2002 |
| JP | 2002-139863 | 5/2002 |
| JP | 2002-515667 | 5/2002 |
| JP | 2002-344279 | 11/2002 |
| JP | 2003-051732 | 2/2003 |
| JP | 2003-087085 | 3/2003 |
| JP | 2003-133892 | 5/2003 |

OTHER PUBLICATIONS

Written Opinion dated Aug. 9, 2005.
International Search Report dated Aug. 9, 2005.

* cited by examiner (a)

(b)

$SiO_2 / AlN = 2.1 / 1.15$

THIN-FILM PIEZOELECTRIC RESONATOR UTILIZING A SECOND OR HIGHER HARMONIC MODE

CROSS REFERENCE TO RELATED APPLICATIONS

The present application is a continuation of International Application No. PCT/JP2005/007834, filed Apr. 25, 2005, which claims priority to Japanese Patent Application No. JP2004-136940, filed Apr. 30, 2004, the entire contents of each of these applications being incorporated herein by reference in their entirety.

FIELD OF THE INVENTION

The present invention relates to thin-film piezoelectric resonators, and particularly to a thin-film piezoelectric resonator using a thickness vibration mode of a piezoelectric thin film.

BACKGROUND OF THE INVENTION

A variety of thin-film piezoelectric resonators using thickness vibration modes of piezoelectric thin films have been proposed.

For example, a thin-film piezoelectric resonator 1 as shown in FIG. 1 has a $SiO_2$ layer 3 on a substrate 2, and a thin-film portion 4 on the $SiO_2$ layer 3. The thin-film portion includes a piezoelectric thin film 4c sandwiched between opposing electrodes 4a and 4b. An opening 5 is formed in the substrate 2 so that the piezoelectric thin film 4c between the opposing electrodes 4a and 4b and the underlying $SiO_2$ layer 3 produce thickness longitudinal vibration in a second harmonic mode, as indicated by, for example, dotted lines 6. When the $SiO_2$ layer 3 has a thickness of $t_s$ and the piezoelectric thin film has a thickness of $t_p$, the thickness ratio $t_p/t_s$ is set so that the antinode of the thickness vibration is substantially located on the lower electrode 4a. Thus, the electromechanical coupling coefficient of the thin-film piezoelectric resonator 1 can be maximized. The thickness ratio $t_p/t_s$ is a value other than 1 because the $SiO_2$ layer has a different acoustic velocity from the piezoelectric thin film 4c (see, for example, Patent Document 1).

It has been proposed that higher-order anharmonic spuriouses are reduced in the thin-film piezoelectric resonator using thickness longitudinal vibration by providing an irregular nonrectangular polygonal overlap between the upper and lower electrodes (see, for example, Patent document 2).

Patent Document 1: Japanese Unexamined Patent Application Publication No. 2003-87085 (pp. 3-4, FIG. 1)

Patent Document 2: Japanese Unexamined Patent Application Publication No. 2000-332568 (p. 4, FIG. 4)

However, in order to vibrate the nonrectangular overlap between the upper and lower electrodes without any problem, the device chip must have a rectangular area at least circumscribing the nonrectangular shape. The rectangular area must be larger than that in the example having a rectangular overlap between the upper and lower electrodes, and it is difficult to downsize the device chip.

SUMMARY OF THE INVENTION

In view of such circumstances, an object of the present invention is to provide a thin-film piezoelectric resonator that can reduce the higher-order anharmonic spriouses and can achieve downsizing, and a method for manufacturing the same.

In order to overcome the above-described disadvantage, the present invention provides a thin-film piezoelectric resonator having the following structure.

The thin-film piezoelectric resonator includes: a thin-film portion supported by a substrate, acoustically isolated from the substrate, and including a pair of opposing electrodes and a piezoelectric thin film disposed between the electrodes; and an insulating layer disposed on one of the pair of electrodes of the thin-film portion. The thin-film portion and the insulating layer vibrate together in at least one mode of second and higher harmonic modes, and an antinode of the vibration displacement in the at least one mode of the second and higher harmonic modes is located in the insulating layer.

The portions where the thin-film portion is supported by the substrate do not correspond to the overlap between the pair of electrodes when viewed in the direction in which the pair of electrodes is opposed to each other (in other words, in the direction in which the thin-film portion, the insulating layer, and the substrate are stacked). Thus, the thin-film portion in the overlap between the pair of electrodes when viewed from the direction in which the pair of electrodes is opposed, and part of the insulating layer are not constrained by the substrate, and are acoustically isolated. When an alternating voltage is applied between the pair of electrodes, the thin-film portion and part of the insulating layer together generate thickness vibration in the stacking direction. By appropriately selecting the combination of the material and thickness of the piezoelectric thin film and the material and thickness of the insulating layer, over half the antinodes of vibration displacement in at least one mode of second and higher harmonic modes can be located in the insulating layer.

Such a structure can allow the thickness of the thin-film portion to be smaller than the half wavelength in a second or higher harmonic mode, so that resonance can be produced only in the thin-film portion. Thus, higher-order anharmonic spriouses can be reduced. In addition, heat generated by vibration is released to the substrate without traveling across the insulating layer. This can enhance the electric power resistance more than the example where the heat is released to the substrate across the insulating layer.

Furthermore, the insulating layer can be etched from above to control the frequency. Also, since the other electrode is formed directly on a Si(100) substrate and the piezoelectric thin film is formed on the electrode, the orientations of the electrode and the piezoelectric thin film can be enhanced.

Preferably, the one of the pair of electrodes has a relatively large thickness and the other electrode has a relatively small thickness.

A thin-film piezoelectric resonator can be easily produced by layering components one on top of another on a substrate. In this instance, steps are formed in the thin-film portion and the insulating layer due to the thickness of the electrode on the substrate. The height of these steps can be reduced by relatively reducing the thickness of the electrode on the substrate side, as in the above structure. Thus, the piezoelectric thin film can be prevented from being easily broken by stress concentration on the steps.

Preferably, when the thin-film portion and the insulating layer vibrate together in a second harmonic mode, the antinode of the second harmonic is located in the insulating layer.

The structure in this instance is simplest.

Preferably, one or both of the pair of electrodes include at least two layers made of different materials.

This structure can further reduce higher-order anharmonic spuriouses. In addition, the characteristics of the thin-film piezoelectric resonator can be further enhanced by, for example, reducing the resistance of the electrodes or increasing the heat transfer coefficient of the electrodes.

Preferably, the piezoelectric thin film is made of AlN or ZnO.

In the above-described structure, an AlN piezoelectric thin film can reduce the elastic energy loss to further enhance the characteristics of the thin-film piezoelectric resonator. A ZnO piezoelectric thin film can increase the electromechanical coupling coefficient to increase the bandwidth of a filter using the thin-film piezoelectric resonators.

Preferably, the insulating layer contains $SiO_2$.

This structure allows the control of the temperature dependency of a filter using the thin-film piezoelectric resonators.

Preferably, the overlap between the pair of electrodes is rectangular when viewed in the direction in which the pair of electrodes is opposed to each other.

This structure allows a plurality of resonator elements to be closely arranged in a small area, and is advantageous to downsizing.

The thin-film piezoelectric resonator of the present invention can reduce higher-order anharmonic spuriouses and can achieve downsizing.

Figure 1:
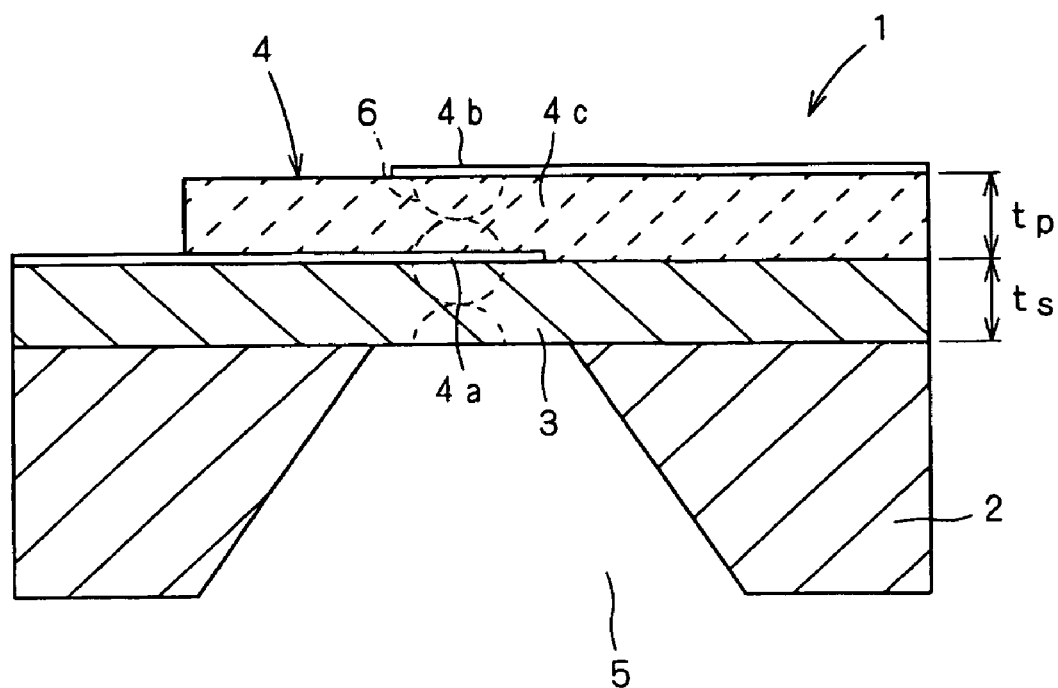
FIG. 1 is a sectional view of the structure of a known thin-film piezoelectric resonator.
Figure 2:
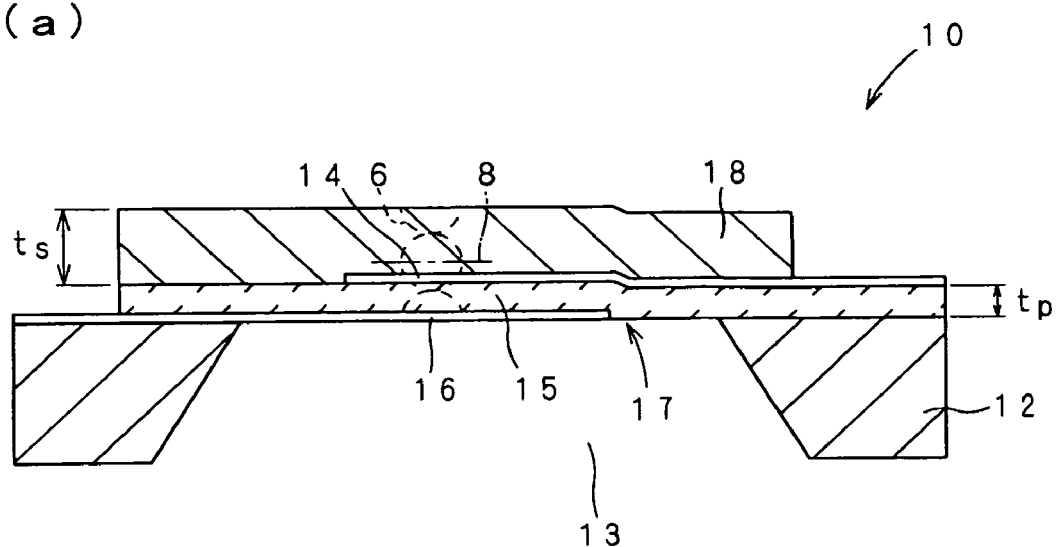
FIG. 2 is a sectional view of the structure of a thin-film piezoelectric resonator in accordance with a first embodiment of the present invention.
Figure 2:
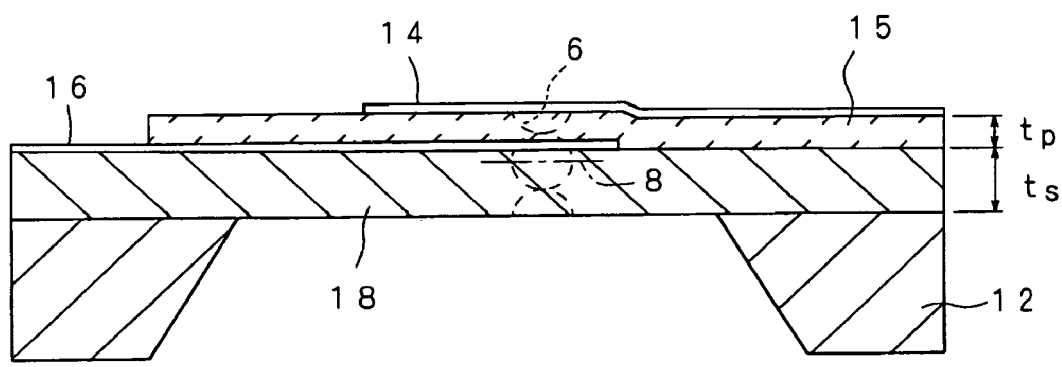

REFERENCE NUMERALS 10 thin-film piezoelectric resonator
12 substrate
14 electrode (one of a pair of electrodes)
15 piezoelectric thin film
16 electrode (the other electrode)
17 thin-film portion
18 insulating layer
20 thin-film piezoelectric resonator
22 substrate
24 electrode (one of a pair of electrodes)
25 piezoelectric thin film
26 electrode (the other electrode)
27 thin-film portion
28 insulating layer
30 thin-film piezoelectric resonator
32 substrate
34 electrode (one of a pair of electrodes)
35 piezoelectric thin film
36 electrode (the other electrode)
37 thin-film portion
38 insulating layer
40 thin-film piezoelectric resonator
42 substrate
44 electrode (one of a pair of electrodes)
45 piezoelectric thin film
46 electrode (the other electrode)
47 thin-film portion
48 insulating layer

DETAILED DESCRIPTION OF THE INVENTION

Embodiments of the present invention will be described with reference to FIGS. 2 to 8.

A thin-film piezoelectric resonator 10 according to a first embodiment will now be described with reference to FIGS. 2 to 5.

As shown in FIG. 2(a), the thin-film piezoelectric resonator 10 includes a substrate 12, a thin-film portion 17 having a piezoelectric thin film 15 sandwiched between an upper electrode 14 and a lower electrode 16 that are opposed to each other, and an insulating layer 18. The thin-film portion 17 is provided on the substrate 12, and the insulating layer 18 is formed on the thin-film portion 17. In the thin-film piezoelectric resonator 10, the thin-film portion 17 and the insulating layer 18 produce composite thickness resonance in a second harmonic mode indicated by dotted lines 6 or a third or higher harmonic mode. Since the insulating layer 18 is not disposed between the substrate 12 and the thin-film portion 17, heat generated in the thin-film portion 17 is easy to conduct to the substrate 12. Accordingly, this structure can enhance the electric power resistance more than the structure in which an insulating layer 3 is disposed between the substrate and the thin-film portion as in the known example shown in FIG. 1.

When the insulating layer 18 has a thickness of $t_s$ and the piezoelectric thin film 15 has a thickness of $t_p$, the thickness ratio $t_p/t_s$ is set, for example, so that the position 8 of the antinode of thickness vibration in a second harmonic mode is located over the upper electrode 14 opposite the substrate 12, and more specifically so that the position 8 of the antinode is located in the insulating layer 18. Thus, higher-order anharmonic spuriouses can be reduced, and details will be described below.

A method for manufacturing the thin-film piezoelectric resonator 10 will now be specifically described.

First, an electrode pattern including the lower electrode 16 and an electrode pad (not shown) connected to the lower electrode 16 is formed of an electrode material, such as Pt, Al, Mo, W, Ti, Cr, Co, or Ru (may be an alloy or a multilayer composite) on the substrate 12 made of for example Si by vapor deposition, sputtering, or any other process. Patterning is performed by lift-off, dry etching, wet etching, or any other process.

For example, a resist pattern is formed on the substrate by photolithography, and then Ti and Pt are vapor-deposited in that order. The Ti layer is used as an adhesion layer and has a small thickness of about 10 nm. This thickness does not substantially affect vibration. Then, the resist is removed to perform lift-off. Thus, the electrode pattern is formed in a desired shape, including the lower electrode 16.

A thin insulating layer may be disposed between the Si substrate 12 and the lower electrode 16 to interrupt effects of certain electroconductivity of the Si substrate on the thin-film piezoelectric resonator.

Then, ZnO or AlN is deposited as a piezoelectric thin film material to form the piezoelectric thin film 15 by vapor deposition, sputtering, CVD, and so forth. For example, AlN is deposited by RF magnetron sputtering.

The piezoelectric thin film is partially removed to expose the electrode pad connected to the lower electrode 16 by, for example, wet etching, dry etching, or lift-off using a sacrifice layer. Wet etching uses a strong alkali, such as TMAH, KOH, NaOH, as the etchant. Dry etching uses a reactive gas mainly containing $Cl_2$. The mask is made of an elemental metal such as Ti, Cr, Ni, Au, or Pt, a multilayer composite or an alloy of these metals, or a photoresist. Preferred methods include lift-off using a ZnO sacrifice layer and wet etching through a metal or resin mask with an aqueous solution of a strong alkali.

Then, an electrode pattern including the upper electrode 14 and electrode pads (not shown) connected to the electrode 14 is formed on the piezoelectric thin film 15 in the same manner as in the formation of the lower electrode 16. In order to reduce the electrical resistance of wiring, the wiring portion is formed by depositing a metal mainly containing Al, Cu, or the like, except for the vibrating region where the electrodes 14 and 16 are opposed to each other.

Then, a $SiO_2$, SiN, or SiON layer is deposited on the upper electrode 14 and the piezoelectric thin film 15 by sputtering, vapor deposition, CVD, and so forth, thus forming the insulating layer 18. Subsequently, the $SiO_2$, SiN, or SiON layer is partially removed by wet etching or dry etching so that the electrode pad connected to the upper electrode 14 can be extracted.

For example, a $SiO_2$ layer is formed by RF magnetron sputtering, subsequently coated with a resist by photolithography except for the region to be removed, and then subjected to wet etching with an etchant mainly containing HF.

Then, the portion of the substrate 12 adjacent to the vibrating region (the region where the electrodes 14 and 16 are opposed to each other and the insulating layer 18 in the region over the opposing region) is removed to form a cavity 13 by wet etching, dry etching, and so forth. Wet etching is performed through a $SiO_2$ or SiN mask using an etchant such as KOH, TMAH, or fluoro-nitric acid. Dry etching is performed through a mask made of photoresist, $Sio_2$, SiN, Ti, Cr, Ni, and so forth by CCP (Capacitively Coupled Plasma)-RIE, ICP (Inductively Coupled Plasma)-RIE, ECR (Electron Cyclone Resonance)-RIE, RIBE (Reactive Ion Beam Etching)-RIE, or the like using a single-constituent gas, such as $SF_6$ or $CF_4$, or a reactive gas prepared by mixing $O_2$ or $CHF_3$ to $SF_6$ or $CF_4$.

If the substrate 12 is made of Si, the piezoelectric thin film 15 is made of AlN, and the lower electrode 16 is made of Pt or Al, the lower electrode 16 and the AlN piezoelectric thin film 15 can serve as an etch stop layer when the cavity 13 is formed in the substrate 12 by dry etching.

Specifically, when the Si substrate 12 is etched from below to form the cavity 13 under the vibrating region, the lower electrode 16 and the piezoelectric thin film 15 are exposed by the progress of etching. If the lower electrode 16 is formed of Pt or Al and the piezoelectric thin film 15 is formed of AlN, such lower electrode 16 and piezoelectric thin film 15 are not etched by $SF_6$. If a Ti layer is formed to a thickness of about 10 nm as the adhesion layer between the substrate 12 and the lower electrode 16 and piezoelectric thin film 15, the Ti layer is etched in the cavity 13 to expose the Pt or Al layer of the lower electrode 16, but the portion of the Ti layer other than the portion intended for the cavity 13 is left between the Si substrate 12 and the lower electrode 14. Since the AlN layer of the piezoelectric thin film 15 is not etched by $SF_6$, etching is stopped as the AlN layer of the piezoelectric thin film 15 is exposed.

Since the lower electrode 16 and the piezoelectric thin film 15 thus serve as an etch stop layer against $SF_6$, the variation in thickness of the vibrating region can be reduced, and spuriouses and ripples can be reduced.

On the other hand, in the known embodiment in which a $SiO_2$ layer is formed on the Si substrate, the $Sio_2$ layer is easily etched by $SF_6$ even after the $Sio_2$ layer has been exposed by etching the Si substrate. Consequently, the thickness of the vibrating region has large variations. An additional etch stop layer may be formed of, for example, AlN between the Si substrate and the $SiO_2$ layer so that the etching is stopped as the etch stop layer is exposed. However, the number of steps is undesirably increased in the process of film formation.

Figure 3:
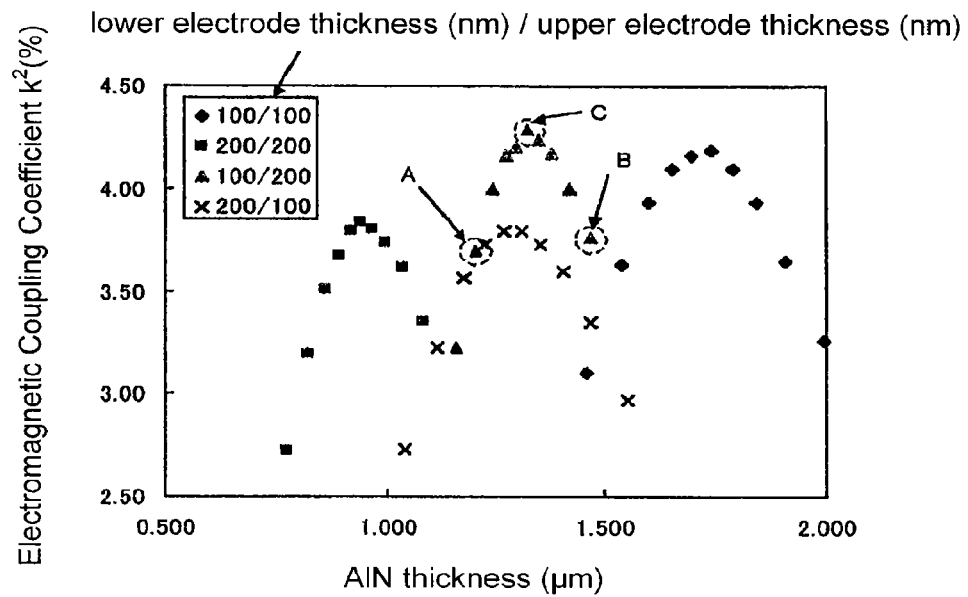
FIG. 3 is a plot of the relationship between the thickness of an AlN layer and the electromechanical coupling coefficient in the embodiment shown in FIG. 2.

FIG. 3 shows the results of calculation for the relationship between the thickness of the AlN layer and the electromechanical coupling coefficient $k^2(\%)$ of the thin-film piezoelectric resonator 15 in an example of the thin-film piezoelectric resonator 10 including a AlN piezoelectric thin film 15 and a $SiO_2$ insulating layer 18.

The calculation was performed as a one-dimensional simulation in the thickness direction. The $SiO_2$ thickness of the insulating layer 18 is controlled so that the frequency of the thin-film piezoelectric resonator 10 is kept constant. Specifically, in FIG. 3, whose horizontal axis represents the AlN thickness, as the AlN thickness increases rightward, the $SiO_2$ thickness decreases and hence the thickness ratio of the AlN layer to the $SiO_2$ layer increases. FIG. 3 shows four examples where the combination of the upper electrode 14 and the lower electrode 16 is varied in thickness.

In FIG. 3, black diamond marks indicate the example where the upper electrode 14 has a thickness of 100 nm and the lower electrode 16 has a thickness of 100 nm. Black square marks indicate the example where the upper electrode 14 has a thickness of 200 nm and the lower electrode 16 has a thickness of 200 nm. Black triangles indicate the example where the upper electrode 14 has a thickness of 200 nm and the lower electrode 16 has a thickness of 100 nm. Crosses indicate the example where the upper electrode 14 has a thickness of 100 nm and the lower electrode 16 has a thickness of 200 nm.

The following description will describe the example where the upper electrode 14 has a larger thickness than the lower electrode 16 (the example indicated by black triangle marks where the lower electrode 16 has a thickness of 100 nm and the upper electrode 14 has a thickness of 200 nm).

The thin-film piezoelectric resonator 10 can be easily produced by layering components one on top of another on the substrate 12, as described above. In this instance, the thin-film portion 17 and the insulating layer 18 each have a step due to the thickness of the lower electrode 16 formed on the substrate 12. If the height of the step is large, the piezoelectric thin film 15 may become liable to break, for example. Probably, this is due to stress concentration resulting from the state of complex stress on the step of the piezoelectric thin film 15. If the thickness of the electrode 16 is reduced, the step height of the piezoelectric thin film 15 is reduced and the stress concentration is alleviated accordingly. Consequently, the piezoelectric thin film 15 is prevented from breaking at the step. It is therefore preferable that the thickness of the lower electrode 16 be set relatively small, and that the thickness of the upper electrode 14 be set relatively large (the example indicated by black triangles shown in FIG. 3).

As represented by a letter C in FIG. 3, a thickness combination can maximize the electromechanical coupling coefficient $k^2$. In this instance, the position of an antinode of displacement substantially coincides with the upper electrode 16. However, a resonator having a large Q factor and exhibiting small spuriouses, in spite of having a rather small electromechanical coupling coefficient $k^2$, is desired in some cases. For example, for an electromechanical coupling coefficient $k^2$ of 3.7%, two examples represented by letters A and B can be selected. The example represented by letter A has a lower thickness ratio of the AlN layer to the $SiO_2$ layer than the example represented by letter C, and in which the position of an antinode of displacement is in the $SiO_2$ layer. On the other hand, the example represented by letter B has a larger thickness ratio of the AlN layer to the $SiO_2$ layer than the example represented by letter C, and in which the position of an antinode of displacement is in the AlN layer.

Figure 4A:
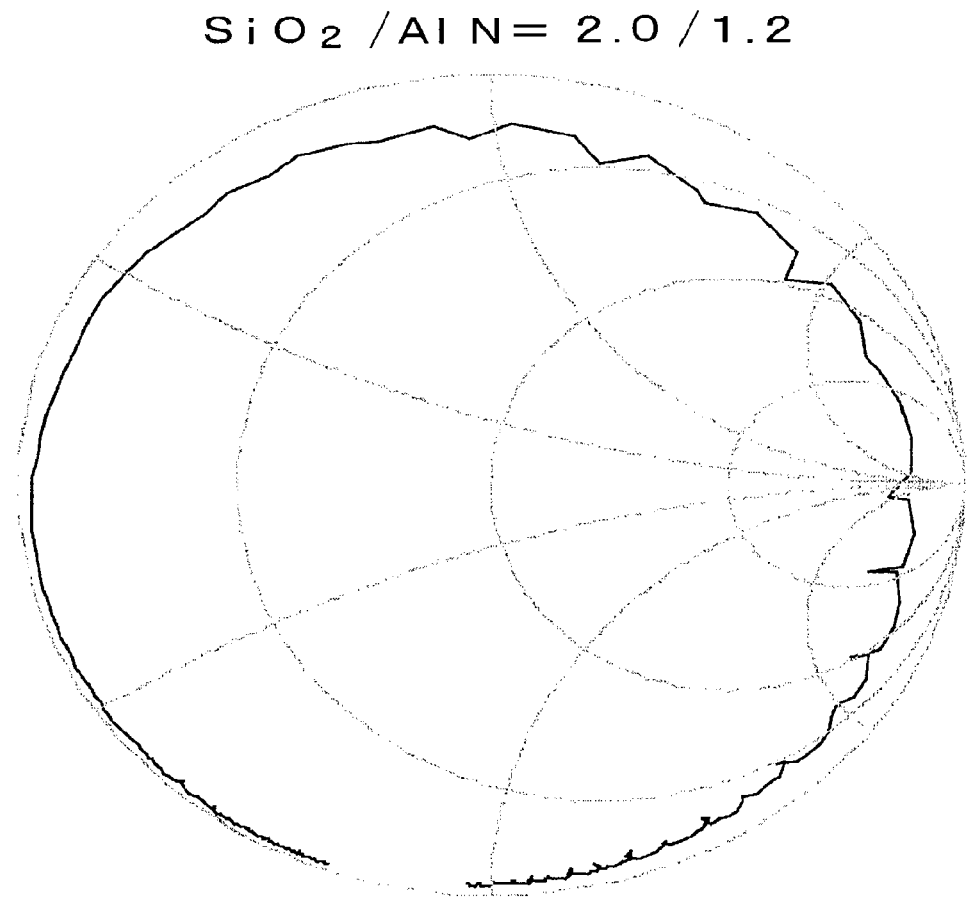
FIG. 4a is a Smith chart when an antinode is located in the insulating layer.
Figure 4B:
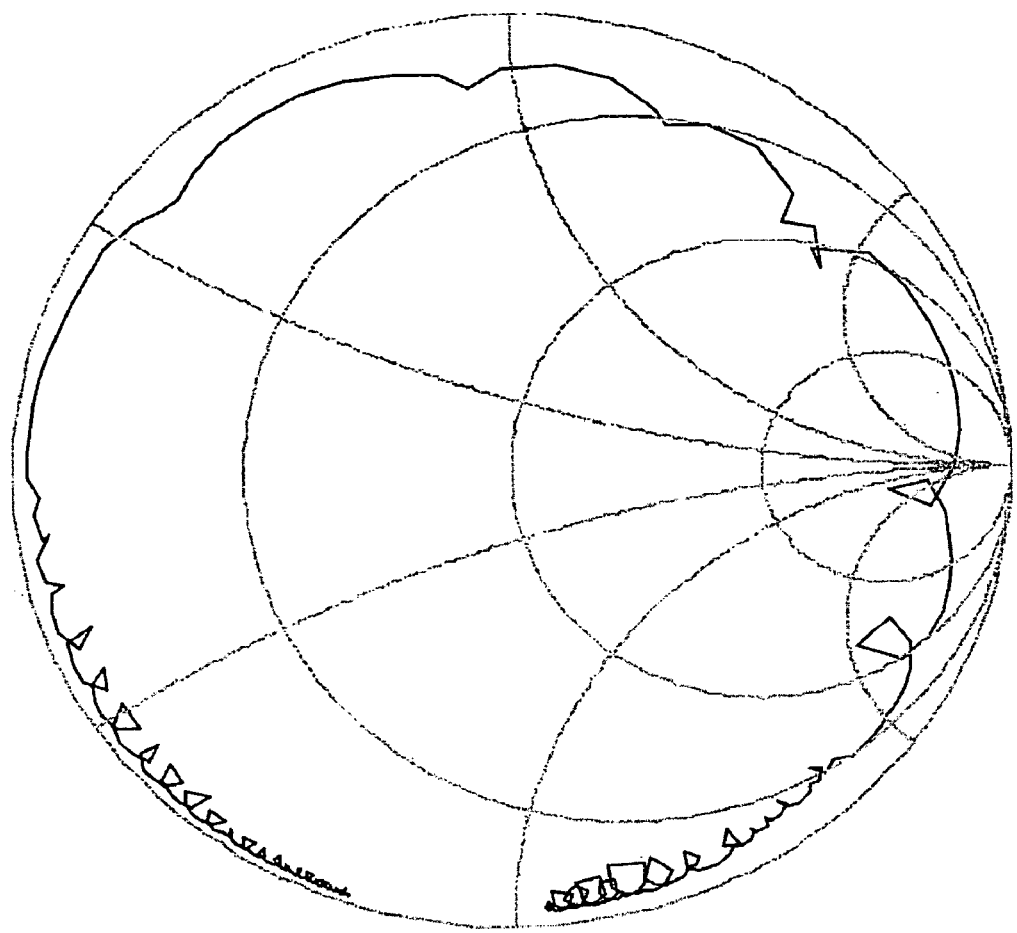
FIG. 4b is a Smith chart when an antinode is located in the piezoelectric thin film.
Figure 4C:
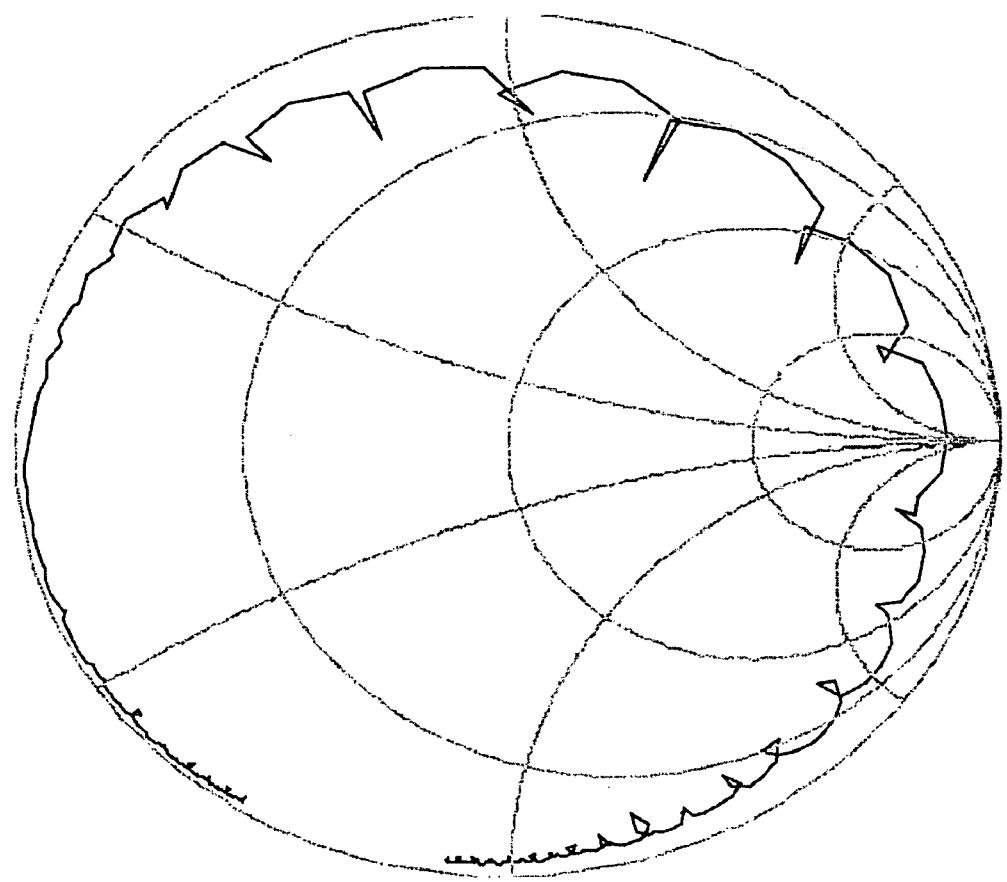
FIG. 4c is a Smith chart when an antinode is located on an electrode.
Figure 4D:
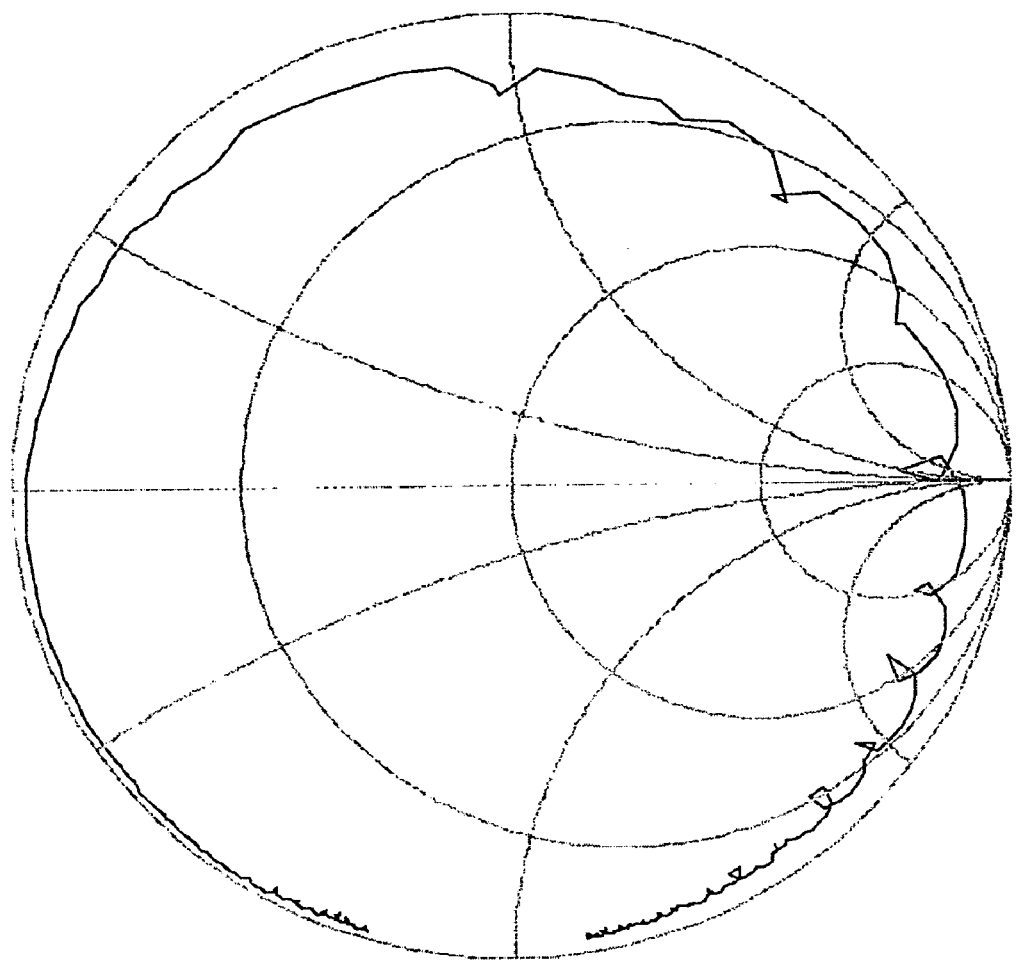
FIG. 4d is a Smith chart when thicknesses are varied.
Figure 4E:
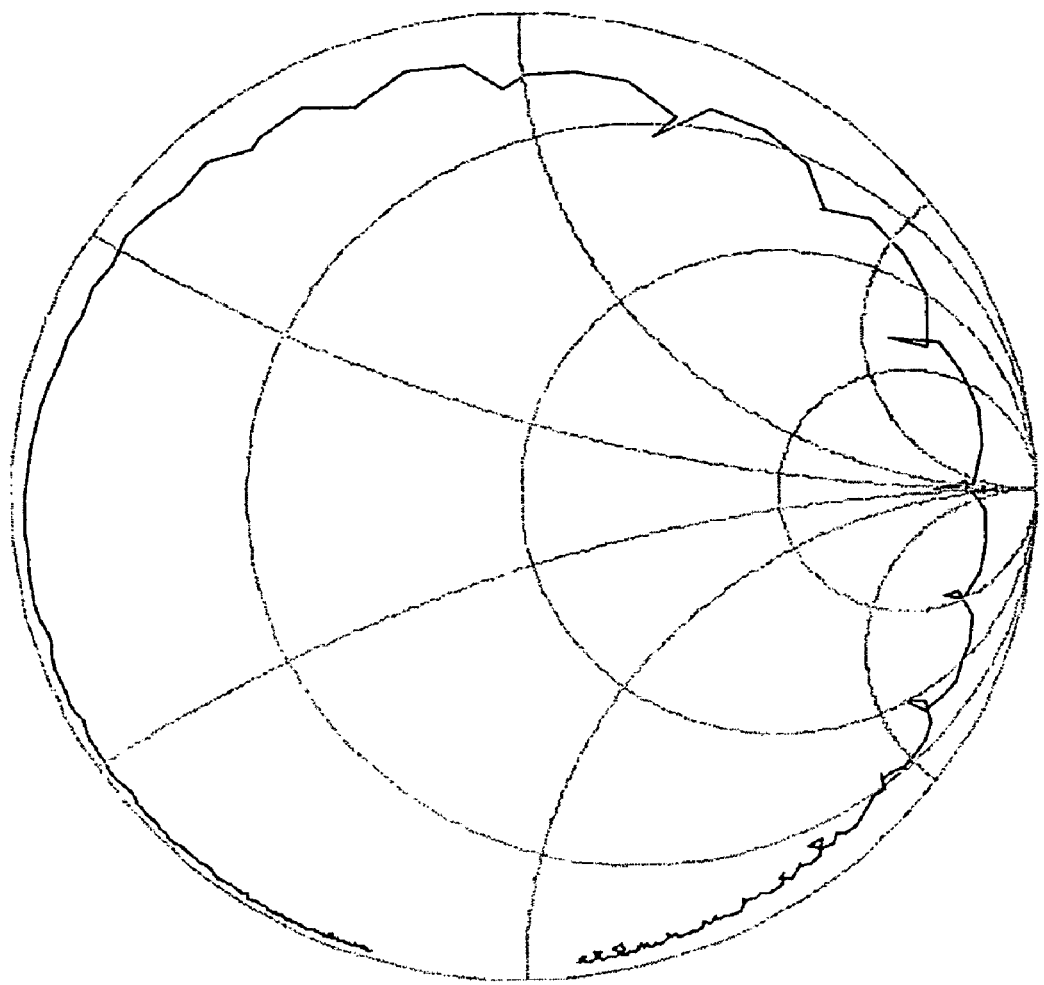
FIG. 4e is a Smith chart when thicknesses are varied.
Figure 4F:
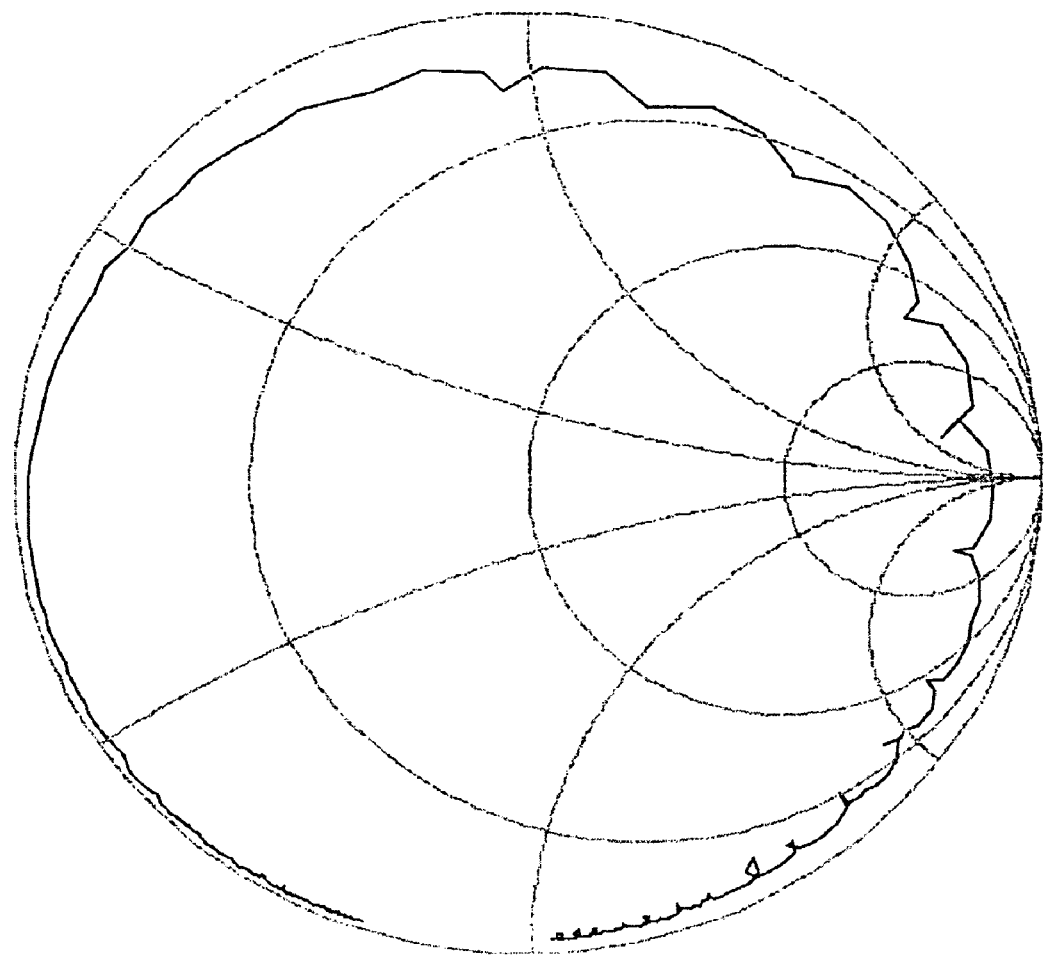
FIG. 4f is a Smith chart when thicknesses are varied.
Figure 4G:
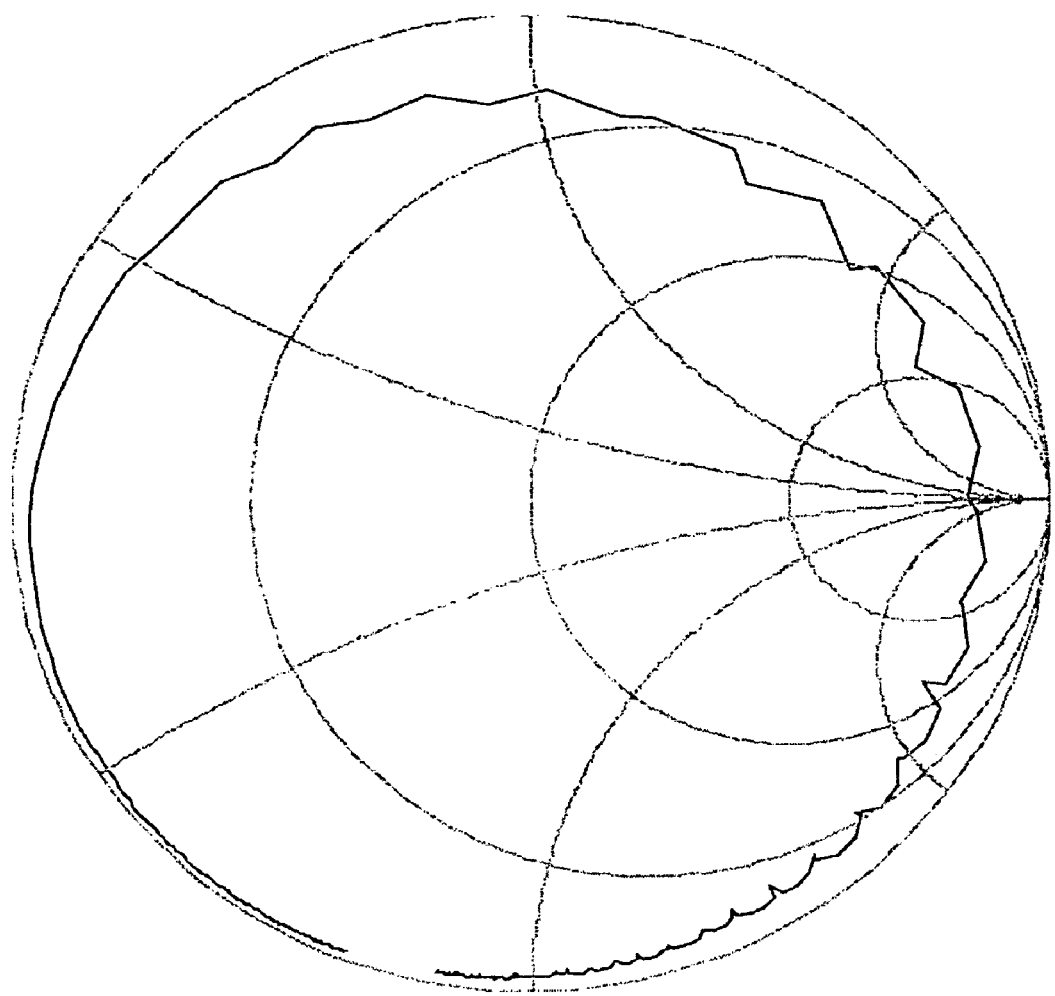
FIG. 4g is a Smith chart when thicknesses are varied.

FIGS. 4a, 4b, and 4c are Smith charts showing the resonance characteristics of the thickness combinations corresponding to letters A, B, and C in FIG. 3, respectively. Axial symmetry analyses using the finite element method can teach states of higher-order anharmonic spuriouses, which are not known from one-dimensional calculation. A resonator whose characteristic curve is drawn along the circumference of the Smith chart has no loss and is ideal. As the characteristic curve is drawn more inward, the loss is increased. Small loops of the characteristic curve mean that spurious vibrations occur.

As for the thickness combination, the thicknesses of the $SiO_2$ insulating layer 18, the Pt upper electrode 14, the AlN piezoelectric thin film 15, and the Pt lower electrode 16 in FIG. 3 in that order are: 2.0 μm, 0.2 μm, 1.2 μm, and 0.1 μm in the structure represented by letter A; 1.2 μm, 0.2 μm, 1.47 μm, and 0.1 μm in the structure represented by letter B; and 1.6 μm, 0.2 μm, 1.32 μm, and 0.1 μm in the structure represented by letter C.

From the comparisons of FIGS. 4a, 4b, and 4c, it is shown that a structure in which the antinode is located outside the piezoelectric thin film 18 (FIG. 4a) exhibits small spuriouses. In contrast, a structure in which the antinode is located inside the piezoelectric thin film 15 (FIG. 4b) exhibits large spuriouses and causes loss in the resonator.

FIGS. 4d, 4e, 4f, and 4g are respectively Smith charts showing resonator characteristics in examples D, E, and F between letters A and C in FIG. 3 in decreasing order of the piezoelectric thin film thickness and in an example G at a side where the piezoelectric thin film has a smaller thickness than in the example of A. The example of F, where the thicknesses of the $SiO_2$ layer and the AlN layer are 1.9 μm and 1.25 μm respectively, and the example of G, where the thicknesses of the $SiO_2$ layer and the AlN layer are 2.1 μm and 1.15 μm respectively, show that spuriouses are reduced as in A.

Spuriouses may be reduced by the known method of forming the vibrating region into a nonsymmetrical shape as disclosed in Patent Document 2. This method can reduce apparent spuriouses, but does not reduce the loss in the resulting resonator.

Figure 5:
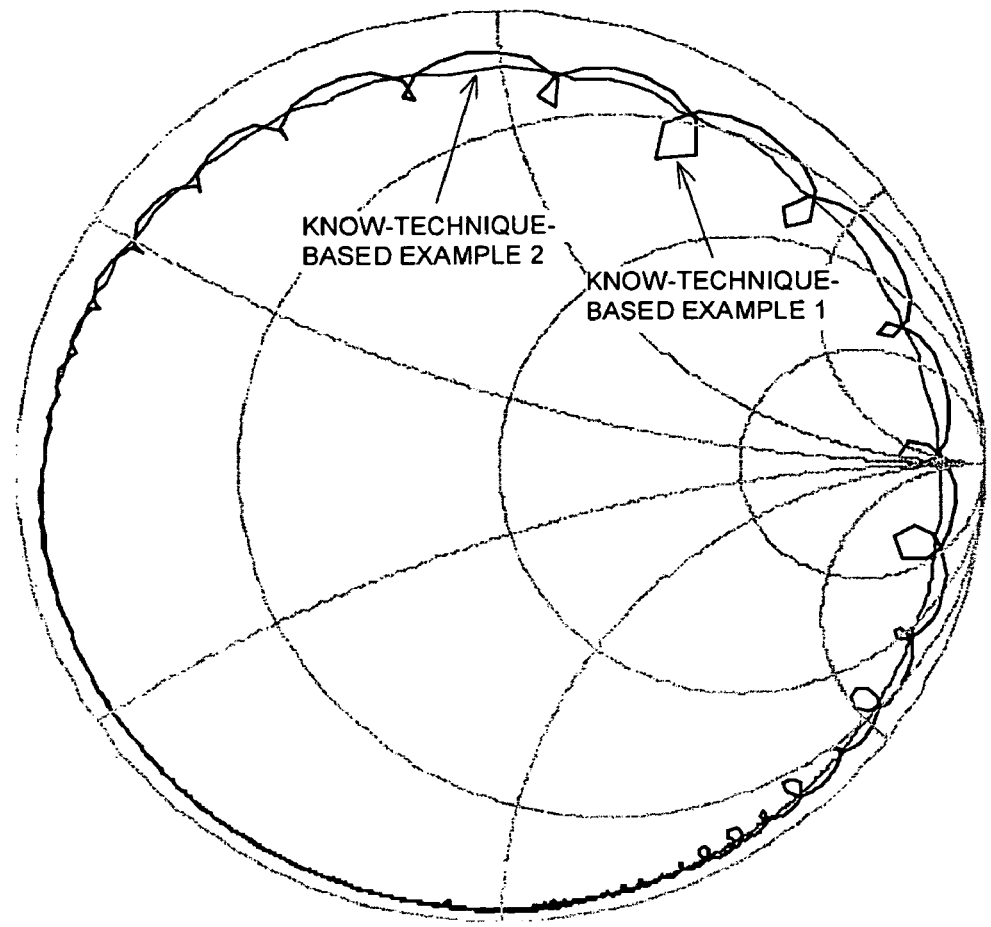
FIG. 5 is a Smith chart when the shape of the vibrating portion is changed.

FIG. 5 is a Smith chart showing the resonance characteristics of known-technique-based example 1 having a sectional structure disclosed in Patent Documents 1 and a square vibrating region and known-technique-based example 2 having a nonrectangular, polygonal vibrating region disclosed in Patent Document 2. Known-technique-based example 2 is apparently improved in spurious characteristics in comparison with known-technique-based example 1, and draws a smooth characteristic curve. However, the characteristic curve is inside the Smith chart. It is thus shown that the loss is not necessarily reduced.

On the other hand, in the thin-film piezoelectric resonator 10 of the first embodiment, the behavior of spuriouses can be controlled only by changing the composition of the layers without varying the shape of the vibrating region. By selecting a composition of the layers that does not cause spuriouses, a highly symmetrical vibrating region in, for example, square shape can be used. This makes layout on a chip easy and facilitates downsizing and cost reduction.

A structure as shown in FIG. 2(b) can also reduce higher-order anharmonic spuriouses. In this structure, the insulating layer is disposed between the substrate and the thin-film portion, and an antinode of displacement of thickness vibration in a second or higher harmonic mode is located in the insulating layer. This structure can be formed by use of $SiO_2$ produced by thermally oxidizing Si for the insulating layer and can compensate the negative temperature coefficient of the piezoelectric thin film effectively.

Figure 6:
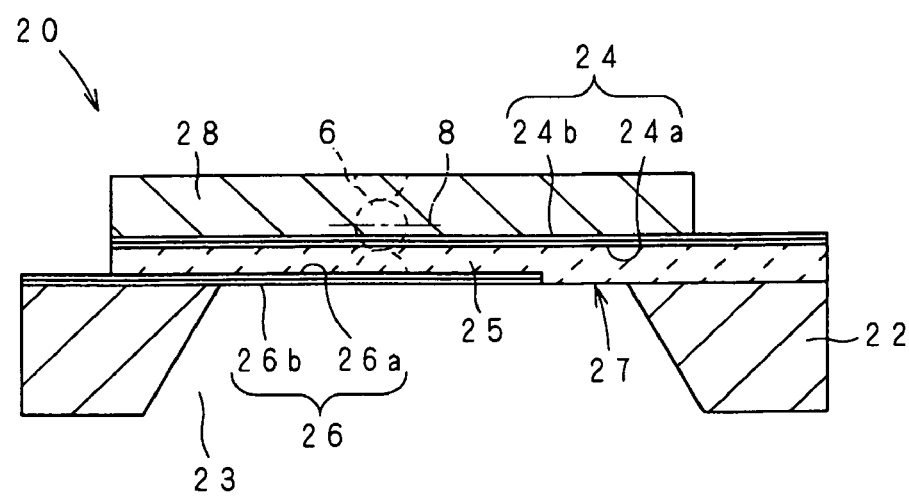
FIG. 6 is a sectional view of the structure of a thin-film piezoelectric resonator in accordance with a second embodiment of the present invention.

A thin-film piezoelectric resonator 20 according to a second embodiment will now be described with reference to FIG. 6.

The thin-film piezoelectric resonator 20 includes a substrate 22, a thin-film portion 27 including a piezoelectric thin film 25 sandwiched between electrodes 24 and 26, and an insulating layer 28, as in the first embodiment. The thin-film portion 27 is formed on the substrate 22, and the insulating layer 28 is formed on the thin-film portion 27. The substrate 22 has a cavity 23. The thin-film portion 27 and the insulating layer 28 overlying the cavity 23 produce thickness longitudinal vibration in a second harmonic mode indicated by dotted lines 6 or in a third or higher harmonic mode. The thicknesses of the insulating layer 28 and the piezoelectric thin film 25 are set so that the position 8 of the antinode of thickness vibration in a second harmonic mode is located in the insulating layer 28.

Unlike the first embodiment, the electrodes 24 and 26 each include a Pt first layer 24a or 26a and an Al second layer 24b or 26b. The first layer 24a or 26a and the second layer 24b or 26b may have a Ti adhesive layer with a thickness of about 10 nm in between.

For example, the thin-film piezoelectric resonator 20 includes, from above, a 1.9 μm thick $SiO_2$ insulating layer 28, an upper electrode 24 including a 0.1 μm thick Al upper second layer 24b and a 0.28 μm thick Pt lower first layer 24a, a 1.2 μm thick AlN piezoelectric thin film 25, and a lower electrode 26 including a 0.05 μm thick Pt upper first layer 26a and a 0.05 μm thick Al lower second layer 26b.

The wiring resistance can be reduced by combined use of the Al second layers 24b and 26b having low electrical resistance with the Pt layers in the electrodes 24 and 26, in comparison with the use of the Pt single-layer electrodes.

Figure 7A:
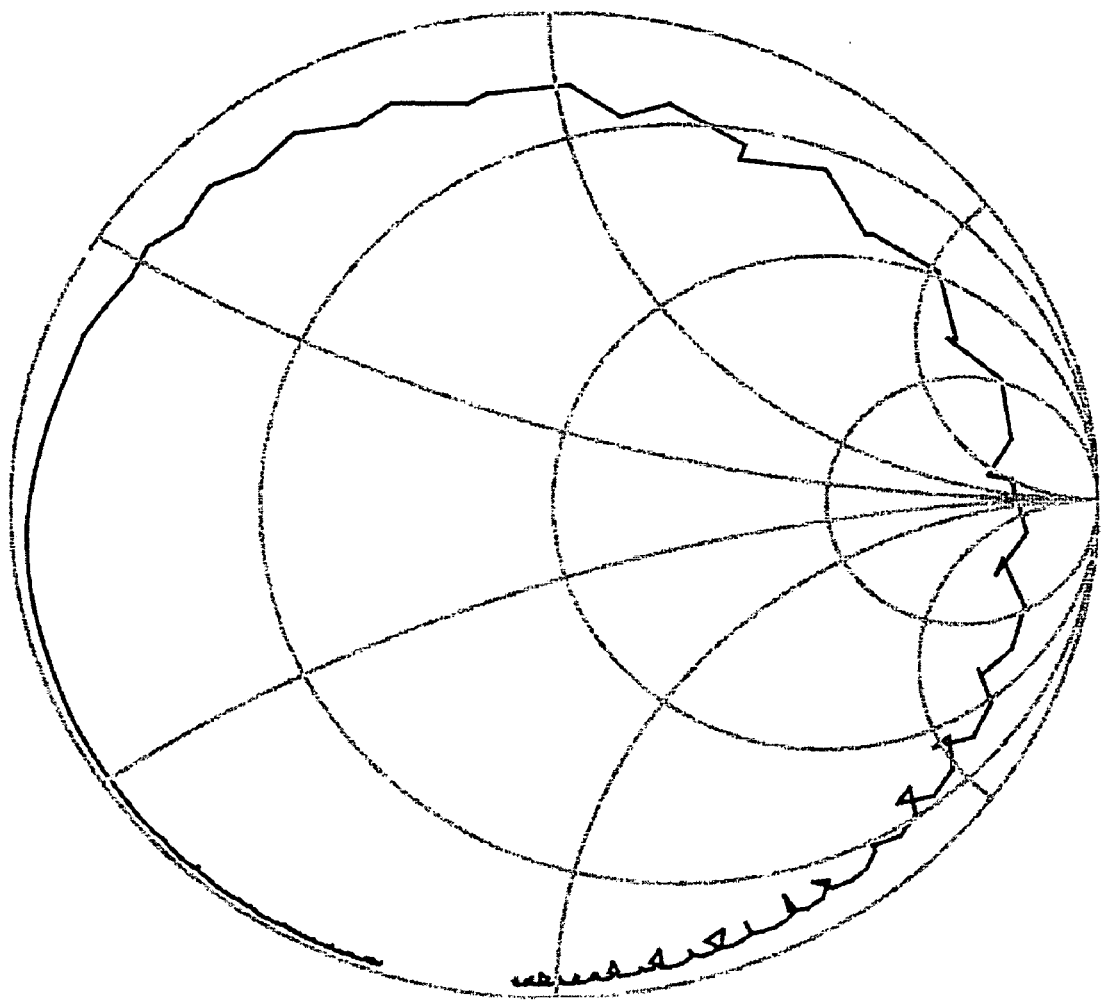
FIG. 7a is a Smith chart when an electrode is defined by a Pt single layer.
Figure 7B:
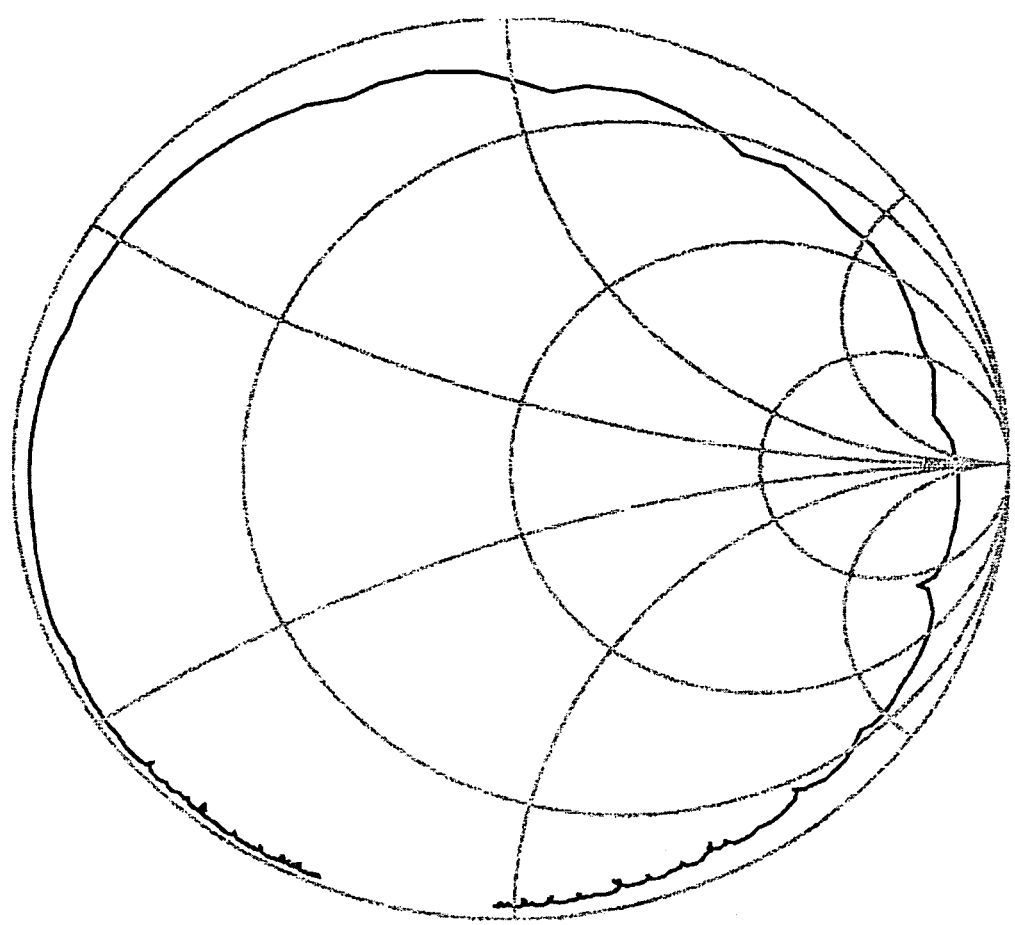
FIG. 7b is a Smith chart when an electrode includes a Pt layer and an Al layer.

FIG. 7a is a Smith chart showing the resonance characteristics of an example using Pt single-layer electrodes, and FIG. 7b is a Smith chart showing the resonance characteristics of the second embodiment using Pt/Al double-layer electrodes. According to the comparison between FIGS. 7a and 7b, it is shown that the use of Pt/Al double-layer electrodes further reduce spuriouses (makes the characteristic curve smooth) and loss (allows the characteristic curve to be drawn close to the circumference of the Smith chart). The calculations for the resonance characteristics do not take the resistance components of the electrodes into account, but result from the decrease in mechanical loss.

Figure 8:
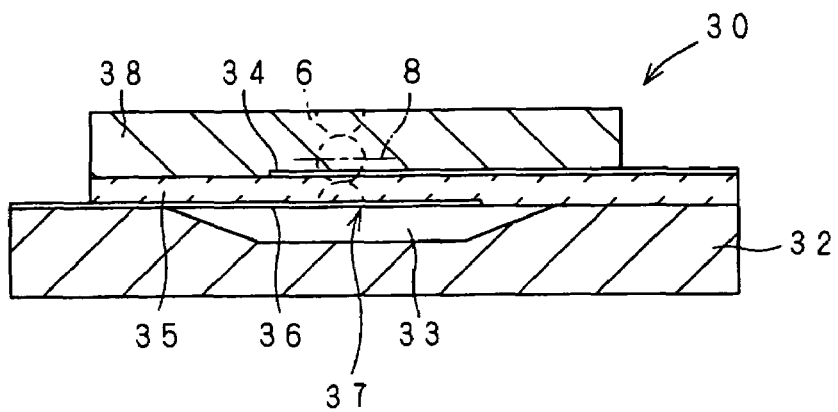
FIG. 8 is a sectional view of the structure of a thin-film piezoelectric resonator in accordance with a third embodiment of the present invention.
Figure 8:
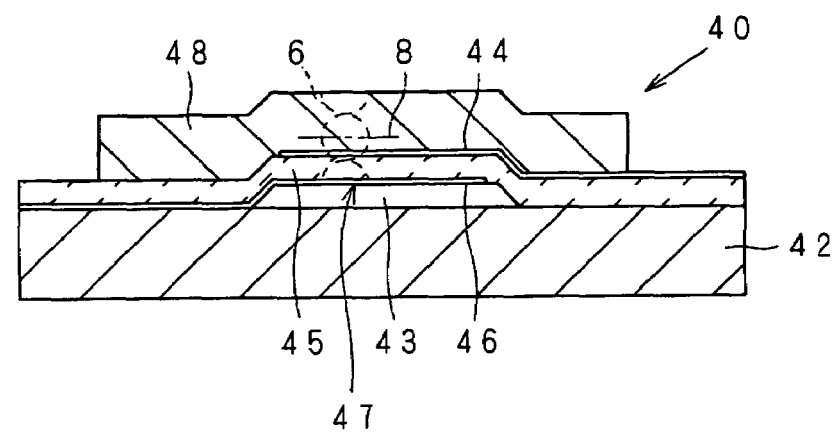

A third embodiment will now be described with reference to FIG. 8.

Thin-film piezoelectric resonators require being acoustically separate from the substrate so that vibration does not propagate to the substrate. In the first and the second embodiment, the cavity 13 or 23 is formed in the substrate 12 or 22 from the lower surface to separate the resonator from the substrate 12 or 22. In the third embodiment, a gap 33 or 43 is formed in a substrate 32 or 42 at the upper surface side to separate the resonator from the substrate 32 or 42.

Specifically, a thin-film piezoelectric resonator 30 shown in FIG. 8(a) has a thin-film portion 37 including a piezoelectric thin film 35 sandwiched between electrodes 34 and 36 on the substrate 32, and an insulating layer 38 formed on the thin-film portion 37, as in the first embodiment. The position 8 of the antinode of thickness vibration in a second harmonic mode is located in the insulating layer 38, as indicated by dotted lines 6.

Unlike the first and the second embodiment, the substrate 32 has a gap 33 formed from the upper surface side without passing through the substrate 32.

As in the first embodiment, a thin-film piezoelectric resonator 40 shown in FIG. 8(b) has a thin-film portion 47 including a piezoelectric thin film 45 sandwiched between electrodes 44 and 46 on the substrate 42, and an insulating layer 48 on the thin-film portion 47, and the position 8 of the antinode of thickness vibration in a second harmonic mode is located in the insulating layer 48 as indicated by dotted lines 6.

Unlike the first and the second embodiment, part of the thin-film portion 47 is lifted from the substrate 42 to define a gap 43 at the upper surface side of the substrate 42.

In both the thin-film piezoelectric resonators 30 and 40, a single gap 33 or 43 is formed in a single resonator, and the area of the portion of the thin-film portion 37 or 47 over the gap 33 or 43 is reduced. Accordingly, the thin-film portion 37 or 47 becomes difficult to break and the yield is increased. Furthermore, since the substrate 32 or 42 does not have a through hole (opening formed from the lower surface), wafers are easy to handle.

Figure 9:
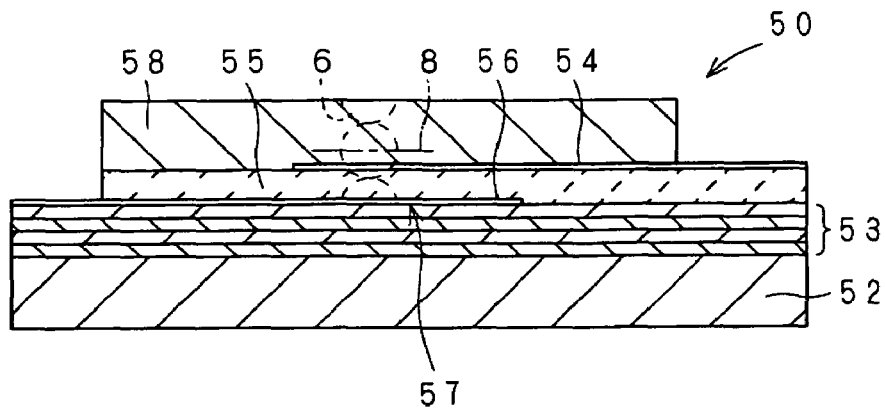
FIG. 9 is a sectional view of the structure of a thin-film piezoelectric resonator in accordance with a fourth embodiment of the present invention.

A thin-film piezoelectric resonator 50 according to a fourth embodiment will now be described with reference to FIG. 9.

The thin-film piezoelectric resonator 50 has an acoustic refection layer 53 on a substrate 52, instead of the cavity or the gap. A thin-film portion 57 including a piezoelectric thin film 55 sandwiched between electrodes 54 and 56 is formed on the acoustic refection layer 53, and an insulating layer 58 is formed on the thin-film portion 57.

The acoustic refection layer 53 acoustically separates the resonator from the substrate 52 so that vibration does not propagate to the substrate 52, and allows the thin-film portion 55 and the insulating layer 58 produce thickness vibration in a second harmonic mode as indicated by the dotted line 6. The thicknesses of the piezoelectric thin film 55 and the insulating layer 58 are set so that the position 8 of the antinode of the second harmonic is located in the insulating layer 58.

Since the thin-film piezoelectric resonator 50 does not have a cavity or a gap under the thin-film portion 57, it can be strong and is easy to manufacture.

The thin-film piezoelectric resonator of the present invention is not limited to the above-described embodiments, and various modifications may be made in the resonator.

For example, the shape of the overlap of the electrodes sandwiching the piezoelectric thin film is generally square, but may be circular, rectangular, or axisymmetric.

The invention claimed is:

1. A thin-film piezoelectric resonator comprising:
   a substrate;
   a film portion supported by the substrate and acoustically isolated from the substrate, the film portion including a pair of opposing electrodes and a piezoelectric film disposed between the electrodes; and
   an insulating layer disposed on one of the pair of electrodes of the film portion,
   wherein the film portion and the insulating layer vibrate together in at least one mode of second and higher harmonic modes, and an antinode in the at least one mode of the second and higher harmonic modes is located in the insulating layer, and
   wherein the piezoelectric film is made of AlN or ZnO.

2. The thin-film piezoelectric resonator according to claim 1, wherein the film portion is supported by the substrate with part of one of said pair of opposing electrodes on the substrate.

3. The thin-film piezoelectric resonator according to claim 1, wherein one electrode of the pair of opposing electrodes has a larger thickness than the other electrode.

4. The thin-film piezoelectric resonator according to claim 1, wherein at least one electrode of the pair of opposing electrodes includes at least two layers made of different materials.

5. The thin-film piezoelectric resonator according to claim 1, wherein the film portion includes at least one step.

6. A thin-film piezoelectric resonator according to claim 5, wherein the insulating layer includes at least one step.

7. The thin-film piezoelectric resonator according to claim 1, wherein the pair of electrodes has an overlap therebetween and the overlap is rectangular in shape when viewed in a direction in which the pair of electrodes are opposed to each other.

8. The thin-film piezoelectric resonator according to claim 1, wherein the substrate defines a cavity that acoustically isolates the film portion from the substrate.

9. The thin-film piezoelectric resonator according to claim 1, wherein the substrate defines a gap in an upper surface thereof that does not pass through the substrate, the gap acoustically isolating the film portion from the substrate.

10. The thin-film piezoelectric resonator according to claim 1, wherein part of the film portion is lifted from the substrate to define a gap, the gap acoustically isolating the film portion from the substrate.

11. A thin-film piezoelectric resonator comprising:
   a substrate;
   a film portion supported by the substrate and acoustically isolated from the substrate, the film portion including a pair of opposing electrodes and a piezoelectric film disposed between the electrodes; and
   an insulating layer disposed on one of the pair of electrodes of the film portion,
   wherein the film portion and the insulating layer vibrate together in at least one mode of second and higher harmonic modes, and an antinode in the at least one mode of the second and higher harmonic modes is located in the insulating layer, and wherein the insulating layer contains $SiO_2$.

12. A thin-film piezoelectric resonator comprising a substrate;

a film portion supported by the substrate and acoustically isolated from the substrate, the film portion including a pair of opposing electrodes and a piezoelectric film disposed between the electrodes;

an insulating layer disposed on one of the pair of electrodes of the film portion; and an acoustic reflection layer located between the film portion and the substrate, the acoustic reflection layer acoustically isolating the film portion from the substrate, wherein the film portion and the insulating layer vibrate together in at least one mode of second and higher harmonic modes, and an antinode in the at least one mode of the second and higher harmonic modes is located in the insulating layer.

* * * * *